United States Patent
Vindasius et al.

[11] Patent Number: 6,080,596
[45] Date of Patent: Jun. 27, 2000

[54] METHOD FOR FORMING VERTICAL INTERCONNECT PROCESS FOR SILICON SEGMENTS WITH DIELECTRIC ISOLATION

[75] Inventors: Alfons Vindasius, Saratoga; Kenneth M. Sautter, Sunnyvale, both of Calif.

[73] Assignee: Cubic Memory Inc., Scotts Valley, Calif.

[21] Appl. No.: 08/920,273

[22] Filed: Aug. 22, 1997

Related U.S. Application Data

[63] Continuation-in-part of application No. 08/265,081, Jun. 23, 1994, Pat. No. 5,675,180.
[51] Int. Cl.⁷ .......................... H01L 21/44; H01L 21/48; H01L 21/50; H01L 21/82
[52] U.S. Cl. .......................... 438/15; 438/107; 438/109; 438/110; 438/119; 438/130; 438/612
[58] Field of Search .......................... 438/130, 15, 107, 438/109, 110, 119, 612

[56] References Cited

U.S. PATENT DOCUMENTS

| | | |
|---|---|---|
| 3,679,941 | 7/1972 | Lacombe et al. . |
| 3,691,628 | 9/1972 | Kim et al. . |
| 3,702,025 | 11/1972 | Archer . |
| 3,769,702 | 11/1973 | Searbrough . |
| 3,813,773 | 6/1974 | Parks . |
| 3,999,105 | 12/1976 | Archey . |
| 4,300,153 | 11/1981 | Hayakawa . |
| 4,426,773 | 1/1984 | Hargis . |
| 4,525,921 | 7/1985 | Carson et al. . |
| 4,612,083 | 9/1986 | Yasumoto et al. . |
| 4,613,891 | 9/1986 | Ng et al. . |
| 4,646,128 | 2/1987 | Carson et al. . |
| 4,659,931 | 4/1987 | Schmitz . |
| 4,672,737 | 6/1987 | Carson et al. . |
| 4,677,528 | 6/1987 | Miniet . |
| 4,703,170 | 10/1987 | Schmitz . |
| 4,706,166 | 11/1987 | Go . |
| 4,761,681 | 8/1988 | Reid . |
| 4,764,846 | 8/1988 | Go . |
| 4,783,695 | 11/1988 | Eichelberger . |
| 4,801,992 | 1/1989 | Golubic . |
| 4,803,595 | 2/1989 | Kraus . |

(List continued on next page.)

FOREIGN PATENT DOCUMENTS

| | | |
|---|---|---|
| 0010657 | 5/1980 | European Pat. Off. . |
| 0175870 | 4/1986 | European Pat. Off. . |
| 0178227 | 4/1986 | European Pat. Off. . |
| 0 490 739 A1 | 12/1991 | European Pat. Off. . |
| 0558855 | 9/1993 | European Pat. Off. . |
| 2 638 894 | 11/1988 | France . |
| W8304141 | 11/1983 | WIPO . |
| WO93/00703 | 1/1992 | WIPO . |
| W9203035 | 2/1992 | WIPO . |
| W9401887 | 1/1994 | WIPO . |

*Primary Examiner*—Charles Bowers
*Assistant Examiner*—Josetta Jones
*Attorney, Agent, or Firm*—Trial & Technology Law Group

[57] ABSTRACT

A method for vertically interconnecting stacks of silicon segments. Each segment includes a plurality of adjacent die on a semiconductor wafer. The plurality of die on a segment are interconnected on the segment using one or more layers of metal interconnects which extend to all four sides of the segment to provide edge bonding pads for external electrical connection points. After the die are interconnected, each segment is cut from the backside of the wafer using a bevel cut to provide four inwardly sloping edge walls on each of the segments. After the segments are cut from the wafer, the segments are placed on top of one another to form a stack. Vertically adjacent segments in the stack are electrically interconnected by applying electrically conductive epoxy to one or more sides of the stack. The inwardly sloping edge walls of each of the segments in the stack provide a recess which allows the electrically conductive epoxy to access the edge bonding pads and lateral circuits on each of the segments once the segments are stacked. A dielectric coating is applied to the die to provide a conformal coating to protect and insulate the die and a laser is used to ablate the area over the bond pads to remove the dielectric coating in order to provide for electrical connections to the bond pads.

19 Claims, 14 Drawing Sheets

U.S. PATENT DOCUMENTS

| | | |
|---|---|---|
| 4,807,021 | 2/1989 | Okumura . |
| 4,827,327 | 5/1989 | Miyauchi et al. . |
| 4,862,249 | 8/1989 | Carlson . |
| 4,894,706 | 1/1990 | Sato et al. . |
| 4,897,708 | 1/1990 | Clements . |
| 4,901,136 | 2/1990 | Neugebauer et al. . |
| 4,907,128 | 3/1990 | Solomon . |
| 4,939,568 | 7/1990 | Kato . |
| 4,941,033 | 7/1990 | Kishida . |
| 4,954,875 | 9/1990 | Clements . |
| 4,956,694 | 9/1990 | Eide . |
| 4,956,695 | 9/1990 | Robinson . |
| 4,956,746 | 9/1990 | Gates et al. . |
| 4,959,749 | 9/1990 | Dzarnoski . |
| 4,983,533 | 1/1991 | Go . |
| 4,989,063 | 1/1991 | Kolesar, Jr. . |
| 4,996,583 | 2/1991 | Hatada . |
| 5,006,923 | 4/1991 | Warren . |
| 5,013,687 | 5/1991 | Solomon . |
| 5,019,943 | 5/1991 | Fassbender . |
| 5,025,306 | 6/1991 | Johnson et al. . |
| 5,028,986 | 7/1991 | Sugano et al. . |
| 5,032,896 | 7/1991 | Little et al. . |
| 5,055,425 | 10/1991 | Leibovitz . |
| 5,075,253 | 12/1991 | Sliwa, Jr. . |
| 5,093,708 | 3/1992 | Solomon . |
| 5,104,820 | 4/1992 | Go et al. . |
| 5,111,278 | 5/1992 | Eichelberger . |
| 5,117,282 | 5/1992 | Salatino . |
| 5,128,831 | 7/1992 | Fox, III et al. . |
| 5,135,556 | 8/1992 | Hornback . |
| 5,138,437 | 8/1992 | Kunamoto et al. . |
| 5,138,438 | 8/1992 | Masayuki . |
| 5,146,308 | 9/1992 | Chance et al. . |
| 5,172,303 | 12/1992 | Bernardoni . |
| 5,191,404 | 3/1993 | Wu . |
| 5,191,405 | 3/1993 | Tomita . |
| 5,198,888 | 3/1993 | Sugano . |
| 5,200,300 | 4/1993 | Leibovitz . |
| 5,202,754 | 4/1993 | Bertin . |
| 5,221,642 | 6/1993 | Burns . |
| 5,222,014 | 6/1993 | Lin . |
| 5,229,647 | 7/1993 | Gnadinger . |
| 5,231,304 | 7/1993 | Solomon . |
| 5,247,423 | 9/1993 | Lin et al. . |
| 5,259,110 | 11/1993 | Bross et al. . |
| 5,270,261 | 12/1993 | Bertin . |
| 5,270,571 | 12/1993 | Parks et al. . |
| 5,279,029 | 1/1994 | Burns . |
| 5,283,107 | 2/1994 | Bayer et al. . |
| 5,311,401 | 5/1994 | Gates, Jr. et al. . |
| 5,330,359 | 7/1994 | Walker . |
| 5,377,077 | 12/1994 | Burns . |
| 5,414,637 | 5/1995 | Bertin et al. . |
| 5,420,751 | 5/1995 | Burns . |
| 5,445,994 | 8/1995 | Gilton . |
| 5,446,620 | 8/1995 | Burns et al. . |
| 5,455,740 | 10/1995 | Burns . |
| 5,475,920 | 12/1995 | Burns et al. . |
| 5,479,318 | 12/1995 | Burns . |
| 5,493,476 | 2/1996 | Burns . |
| 5,499,160 | 3/1996 | Burns . |
| 5,543,664 | 8/1996 | Burns . |
| 5,550,711 | 8/1996 | Burns et al. . |
| 5,552,963 | 9/1996 | Burns . |
| 5,561,591 | 10/1996 | Burns . |
| 5,566,051 | 10/1996 | Burns . |
| 5,688,721 | 11/1997 | Johnson . |

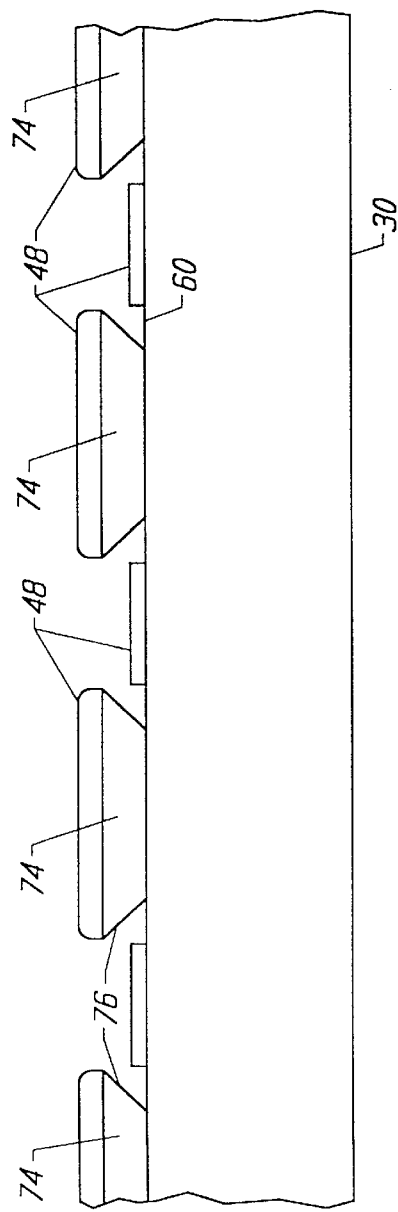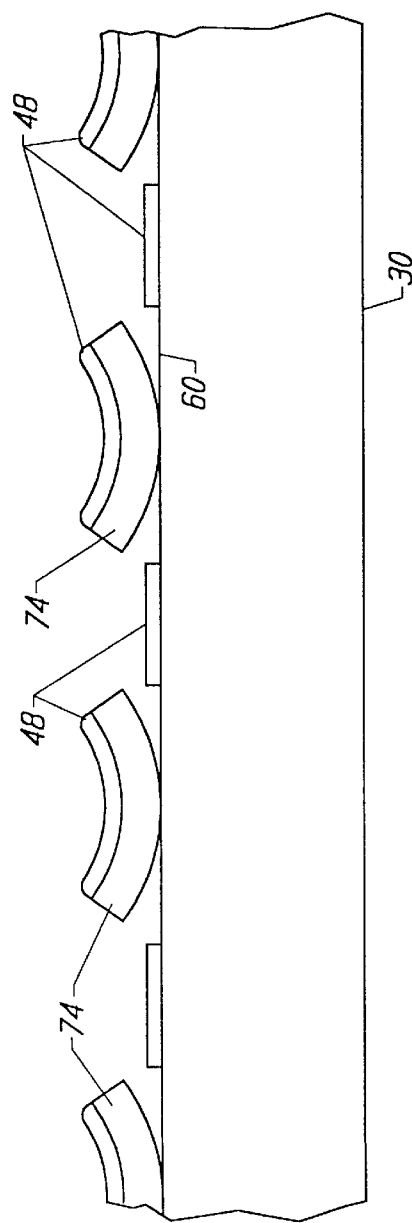
FIG. 7A
FIG. 7B

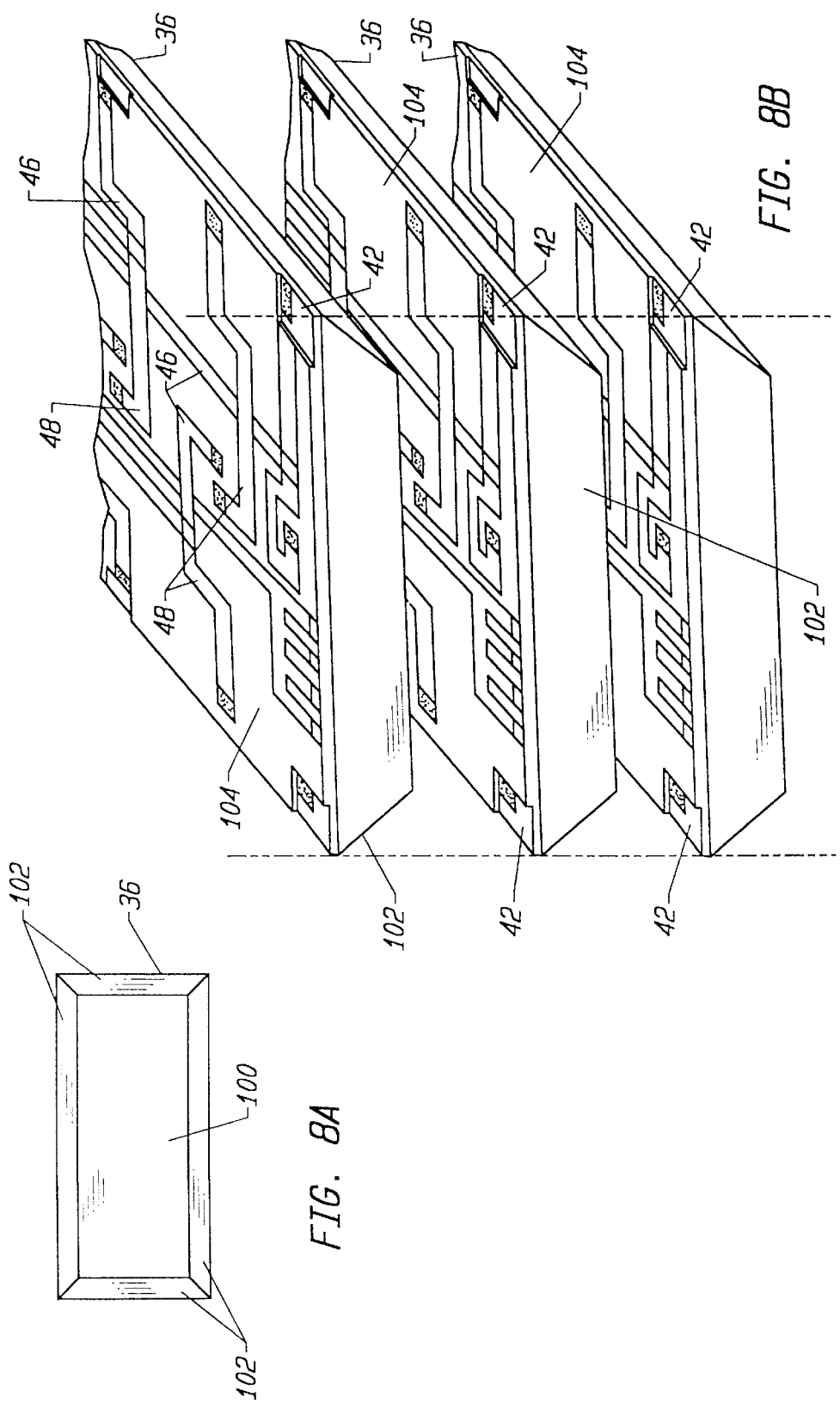

METHOD FOR FORMING VERTICAL INTERCONNECT PROCESS FOR SILICON SEGMENTS WITH DIELECTRIC ISOLATION

CROSS REFERENCE TO RELATED PATENT APPLICATIONS

The present application is a continuation-in-part of co-pending application Ser. No. 08/265,081, now U.S. Pat. No. 5,675,180, filed Jun. 23, 1994 entitled "Vertical Interconnect Process for Silicon Segments", which is assigned to the same assignee as the present application and which is hereby incorporated by reference.

BACKGROUND OF THE INVENTION

The present invention relates to a method for stacking and interconnecting segments of silicon, and more particularly to a method for stacking segments, which include a plurality of die and beveled edge walls, and interconnecting the segments on the edges of the stack using electrically conductive epoxy.

For many years, electrical components such as transistors and integrated circuits have been made using wafers of semiconductor material, including silicon and germanium. Integrated circuits have been provided on the wafer using various techniques known as etching, doping, and layering. Individual integrated circuits that are provided on the wafer are referred to as die, and include contact points called bond pads for external electrical connections. Typically, the die on the wafer are separated from one another by cutting the wafer along boundaries defining the die. Once the die are cut from the wafer, they are referred to as chips, and are packaged for use. In recent years, the proliferation of more powerful electronic systems has led to an increased need for higher density integrated circuit packages.

One method for creating higher density packages attempts to create entire computer systems on a single wafer using wafer scale integration (WSI) techniques. WSI technology attempts to laterally wire together all the die on a wafer using wires to interconnect the die. However, in order to create the necessary interconnections between the die, many wires are required that are extremely thin and difficult to create.

A second method for creating higher density packages attempts to reduce the area required for placing the chips on a circuit board by physically stacking the chips vertically. One chip stacking technique mounts individual die on ceramic carriers, encapsulates both the die and the carrier, stacks the carriers, and then mounts the stack on a printed circuit board. In this technique, all the die in the stack are interconnected by connecting the leads of the die to the printed circuit board via metal pins. This method results in an unusually high pin count on the circuit board which reduces the reliability of the circuitry because the high pin count increases the possibility that one of the many pins may become disconnected from the board.

Another chip stacking method uses a more complex process to stack die, as disclosed in U.S. Pat. No. 5,104,820 issued Apr. 14, 1992. As shown in FIG. 1, this method modifies individual chips 10 so that they may be stacked by adding a pattern of metallization, called rerouting leads 12, to the surface of the wafer. The rerouting leads 12 extend from the bond pads 14 on the chip 10 to newly formed bond pads 11, and are arranged so that all the rerouting leads 12 terminate on one side of the modified chip 10. Each modified chip 10 is then cut from the wafer, as shown by the dotted lines, and assembled into a stack (not shown). The stack is assembled in a manner such that all the leads 12 of the modified chips 10 are aligned along the same side of the stack. The side of the stack having the leads 12 is then etched and polished so that a cross section of the leads 12 on each of the modified chips 12 is accessible. After the leads 12 are exposed, a layer of metallization is applied to the leads 12 along the side of the stack in order to electrically connect each of the modified chips 10 in the stack. The stack is then mounted and connected to a substrate which in turn is connected to conventional circuitry.

The method of rerouting leads offers improvement in circuit density over prior methods but is complex and expensive. In addition, as shown in FIG. 1, the rerouting leads 12 extend over five adjacent die 15 through 19, which are destroyed when the modified chip 10 is cut out of the wafer. In this method, five die are sacrificed for every chip 10 that is modified.

Another method for creating higher density circuits creates stacks from entire wafers, rather than individual chips, to form a wafer array. In some devices, the wafers in the stack are electrically interconnected using solid vertical columns of metallic conductive feed-throughs, such as copper. The use of solid feed-throughs to interconnect wafers may cause damage to the array due to differential thermal coefficients of expansion during thermal cycles. Furthermore, the process is costly and makes the wafers difficult to separate for repairs.

Other methods also exist to interconnect stacks of wafers, as disclosed in, for example, U.S. Pat. No. 4,897,708 issued Jun. 30, 1990, and U.S. Pat. No. 4,954,875 issued Sep. 4, 1990. These methods provide each wafer in the stack with coned-shaped through holes which expose bonding pads on the wafers. The bond pads of the wafers in the stack are then electrically connected by either filling the through holes with electrically conductive liquid, or inserting an electrically conductive compliant material into the through holes, to provide a continuous vertical electrical connection between the wafers. While avoiding the disadvantages of using solid vertical columns of metal to interconnect wafers, the use of electrically conductive liquids and conductive materials requires special tooling to fill the through holes. Furthermore, for some applications, it may not be desirable to use stacks of entire wafers due to size constraints of the electrical device.

SUMMARY OF THE INVENTION

Accordingly, it is an object of the present invention to provide an improved method for stacking and interconnecting segments of silicon.

In one preferred embodiment, the present invention provides a method for vertically interconnecting stacks of silicon segments. Each segment includes a plurality of adjacent die on a semiconductor wafer. The plurality of die on a segment are interconnected on the segment using one or more layers of metal interconnects which extend to all four sides of the segment to provide edge bonding pads for external electrical connection points. After the die are interconnected, each segment is cut from the backside of the wafer using a bevel cut to provide four inwardly sloping edge walls on each of the segments.

After the segments are cut from the wafer, the segments are placed on top of one another to form a stack, as distinguished from both a stack of individual chips and a stack of entire wafers. Vertically adjacent segments in the stack are electrically interconnected by applying electrically conductive epoxy filaments or lines to one or more sides of the stack. The inwardly sloping edge walls of each of the segments in the stack provides a recess which allows the electrically conductive epoxy to access the edge bonding pads and lateral circuits on each of the segments once the segments are stacked. According to a further aspect of the present invention, an insulating dielectric process is used to electrically isolate the entire edge of the die. The dielectric isolation process provides a conformal isolation coating around the edge of the die to protect and insulate the die.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the following detailed description, serve to explain the principles of the invention:

FIGS. 7A and 7B are diagrams illustrating the metal lift-off process which provides metal interconnects on a wafer.

FIG. 8A is a diagram showing the backside of a segment including four beveled side walls after the segment has been cut from a wafer.

FIG. 8B is a diagram showing the front side and the beveled side walls of three segments after being cut from a wafer.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

VIP PROCESS

As referenced above, the present invention is a Continuation-In-Part application of co-pending application Ser. No. 08/265,081, filed Jun. 23, 1994, entitled "Vertical Interconnect Process for Silicon Segments". The details of that VIP process will first be described to provide an overview.

Figure 1:
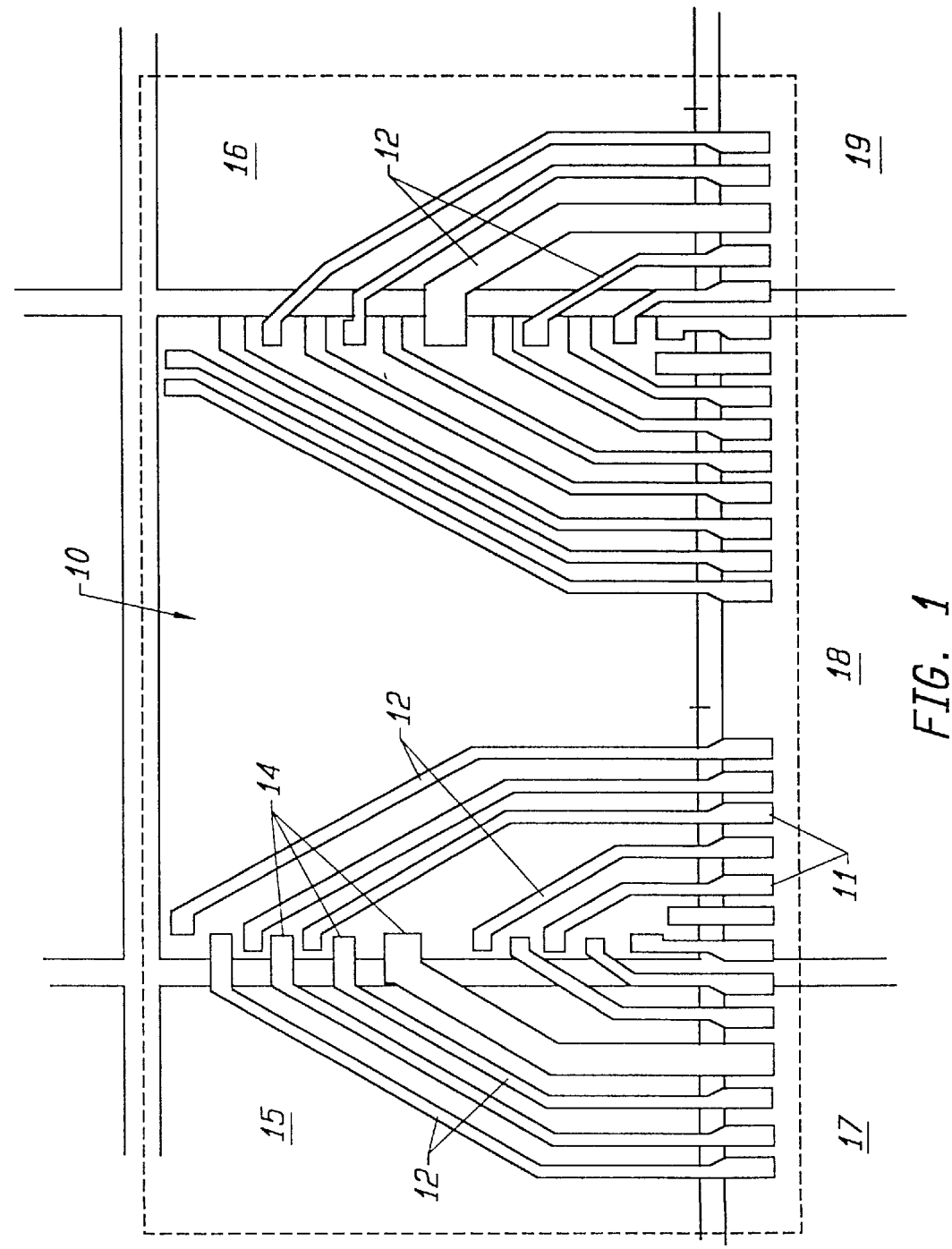
FIG. 1 is diagram illustrating a prior art method for providing rerouting leads along one side of a chip.
Figure 2:
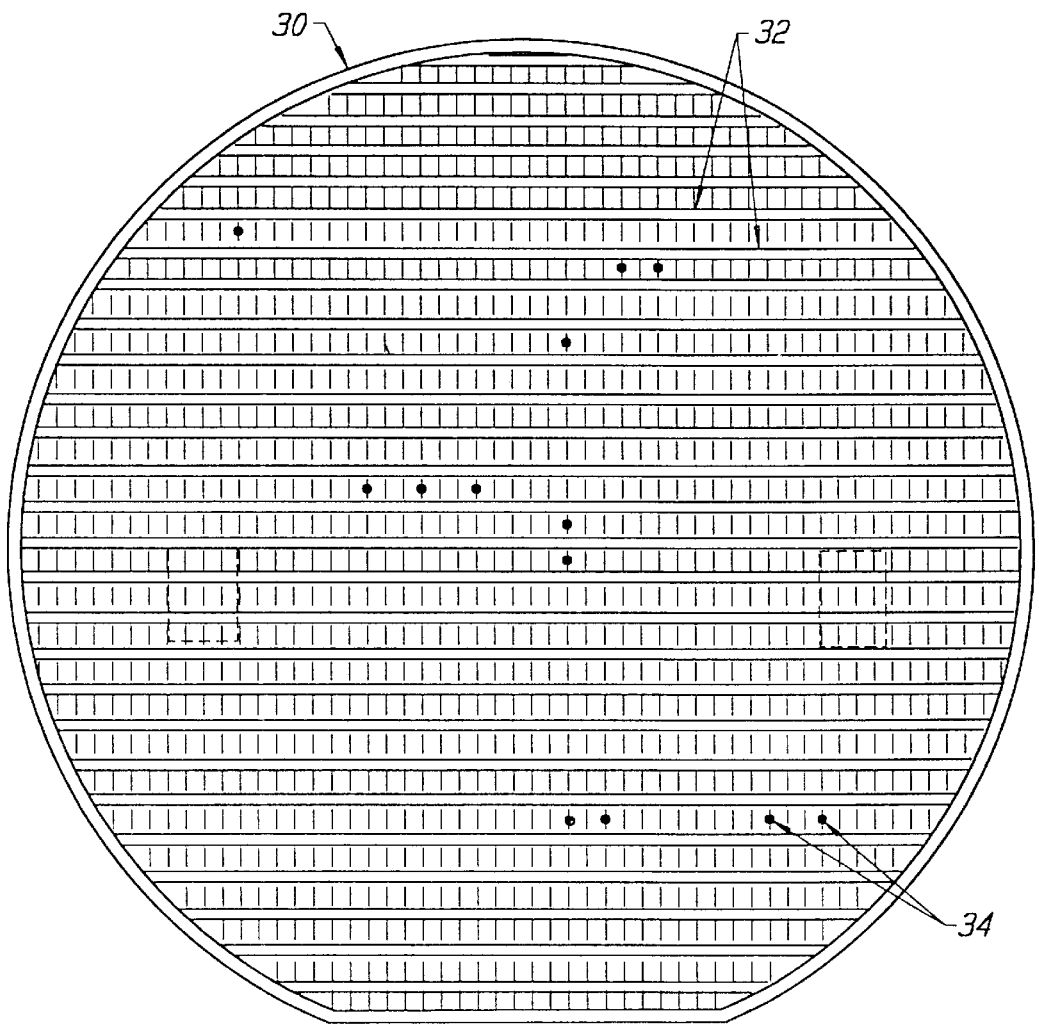
FIG. 2 is diagram illustrating a conventional silicon wafer which includes numerous die.
Figure 3:
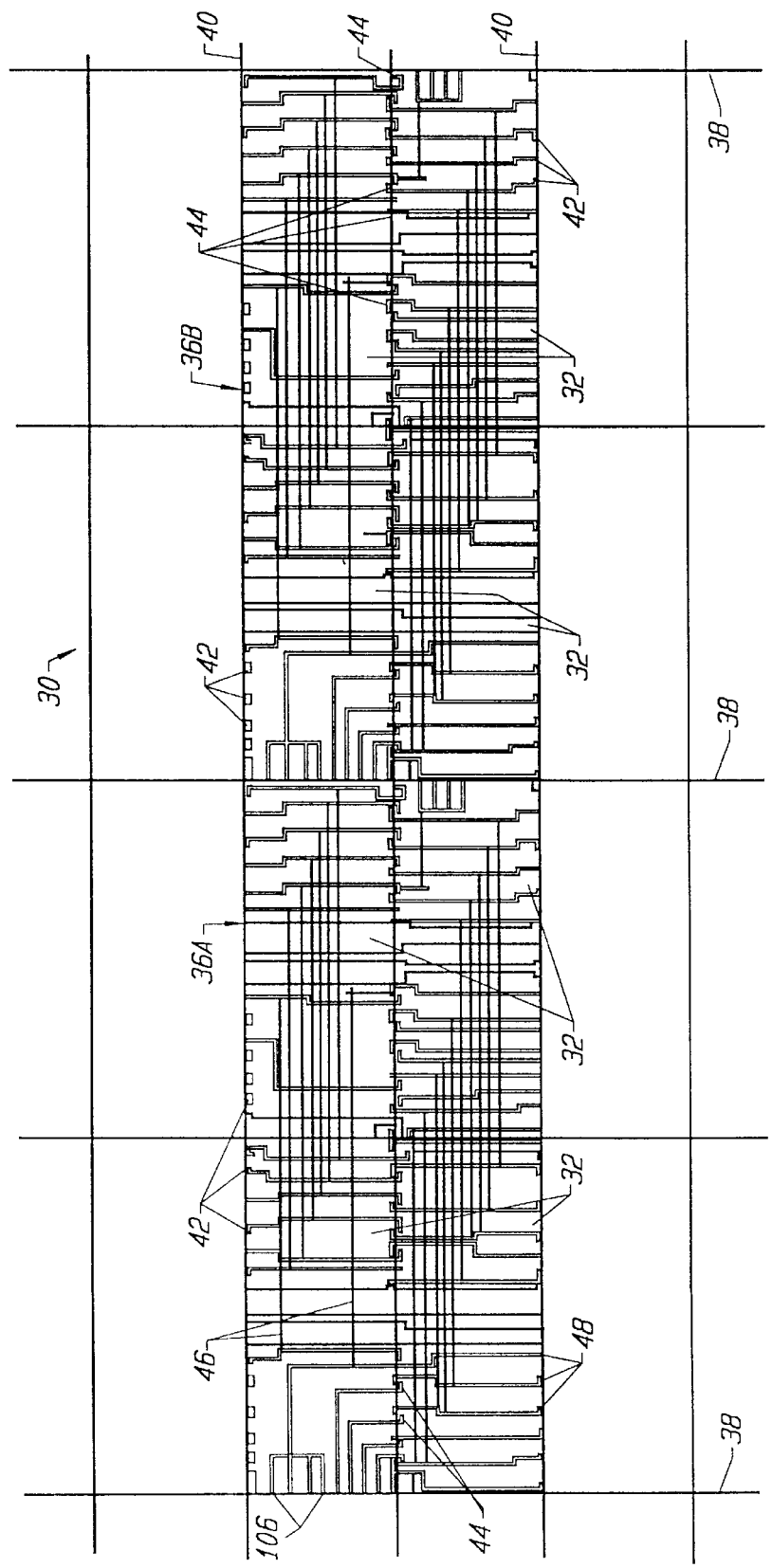
FIG. 3 is diagram illustrating two segments in accordance with the present invention, where each segment includes a two-by-two array of die.

Referring to FIG. 2, the vertical interconnect process will be described beginning with a standard wafer 30 which is supplied by a manufacturer. The squares on the wafer 30 indicate the locations of individual die 32 on the wafer 30. Wafers 30 normally arrive from the manufacturer with non-functioning or defective die which are marked with an ink dot 34. In a preferred embodiment, the wafer 30 is made of silicon. However, the wafer 30 could also be made using alternate materials, such as gallium arsenide. Typically, the die 32 are cut out of the wafer 30 in order to provide a supply individual chips, such as memory chips, for example. In accordance with the prior VIP process, the die 32 are not individually cut out of the wafer 30. Instead, a plurality of adjacent die 32 on the wafer 30 are grouped to form what is referred to as a segment 32, as shown in FIG. 3. However, the die could be cut individually in accordance with the prior VIP process and with the present invention.

FIG. 3 depicts a plane view of two segments 36A and 36B (hereinafter segments 36) on a wafer 30 where each rectangle represents one die 32. Each segment 36 is defined by vertical boundary lines 38 and horizontal boundary lines 40 and each segment 36 includes a group of adjacent die 32 on the wafer 30, which results in a segment 36 having a particular size and shape. In a preferred embodiment, a segment 36 includes four adjacent die 32 arranged in a two-by-two matrix, as shown. Such a segment 36 is referred to as a two-by-two segment. A segment 36, however, may also include any pattern or arrangement of adjacent die 32, such as for example, a one-by-one segment, two-by-one segment, a two-by-four segment, or a four-by-four segment of die 32. Each segment 36 is provided with edge bond pads 42 on one or more sides of the segment 36, which are used as electrical contact points for external connections. Similarly, each of the die 32 includes internal bond pads 44 for connection with internal circuitry of the die 32. Individual segments 36 are separated from the wafer 30 by cutting the wafer 30 along the vertical boundary lines 38 and horizontal boundary lines 40, which are typically referred to as streets. The process of cutting the segments 36 from the wafer 30 is described further below.

One feature of the VIP process is that the individual die 32 on a segment 36 are interconnected using multiple layers of die interconnect circuitry. The die interconnect circuitry includes a plurality of metal traces which are orientated in both the x and y directions on the surface of the segment 32. The metal traces are referred to as x-interconnects 46 and y-interconnects 48 and function to communicate power and signals from the edge bond pads 42 of the segment 36 to selected internal bond pads 44 of the individual die 32.

Figure 4:
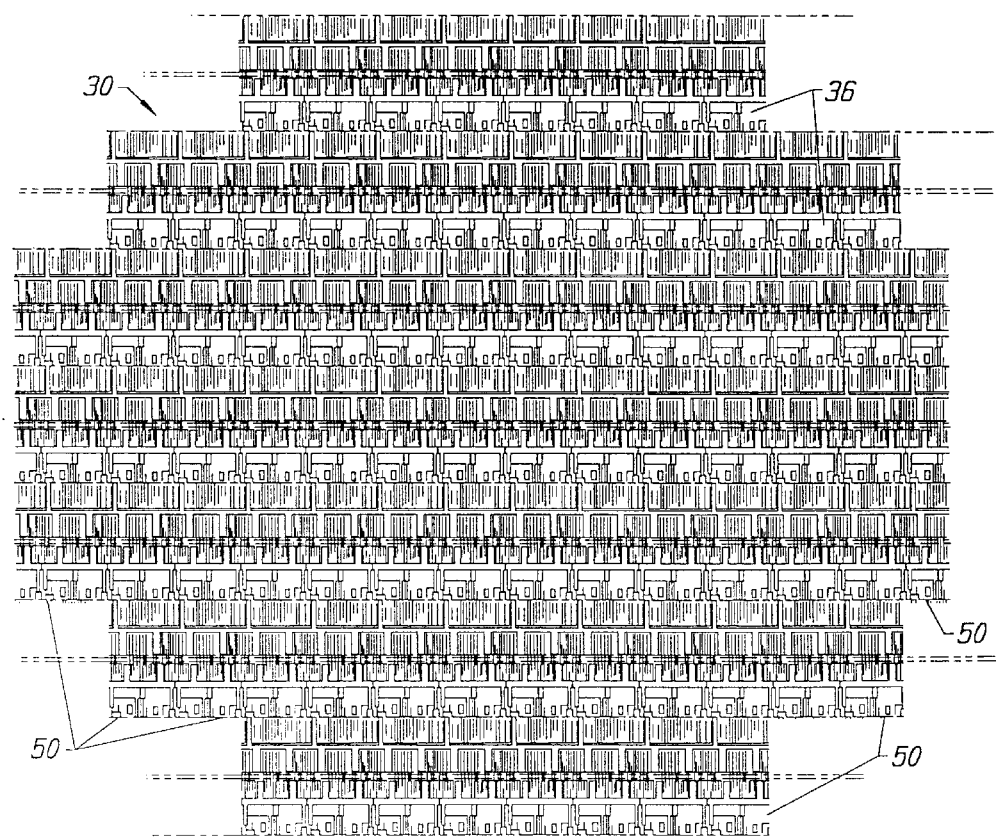
FIG. 4 is a diagram illustrating a plurality of segments laid out across a wafer.

FIG. 4 depicts a diagram illustrating a plurality of segments 36 laid out across a wafer 30. At the periphery of the wafer 30, the bond pads of individual die 32 (see FIGS. 2 and 3) are routed appropriately to create a one-by-one segment 50.

Referring again to FIG. 3, in order to apply the metal x- and y-interconnects 46 and 48 on the surface of the wafer 30 to interconnect the individual die 32, the ink dots 34 (FIG. 2) which indicate defective die must first be removed so that the ink dots 34 do not interfere with the metal interconnects 46 and 48. The ink dots 34 are removed from the wafer 30 using a conventional positive resist stripper. A positive resist stripper is a material commonly used in the industry to dissolve and remove unwanted substances from a particular surface without damaging the original surface. After the ink dots 34 are removed, the metal interconnects 46 and 48 are applied to the wafer 30 during a wafer interconnect process.

Figure 5A:
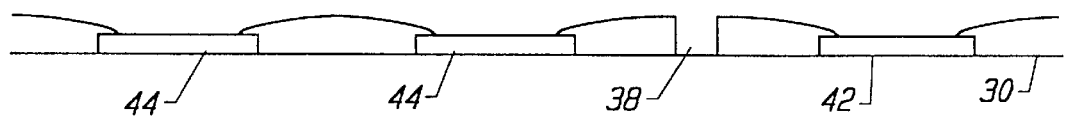
FIG. 5A–5H are cross-sectional views of a portion of a wafer and illustrates the multiple layers of material applied to the wafer in order to interconnect the die of a segment.
Figure 5B:
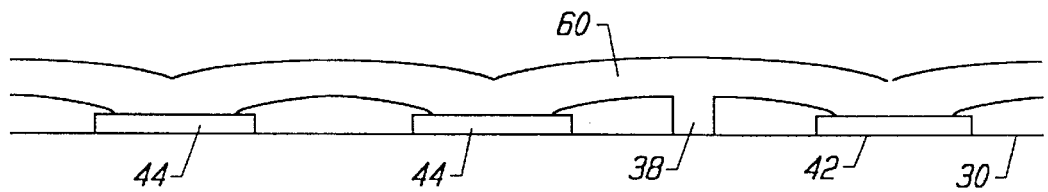

Referring now to FIGS. 5A–5H, a cross-sectional view of a portion of the wafer 30 is shown. As stated above, the surface of the wafer 30 includes a plurality of internal bond pads 44 belonging to individual die 32 (see FIGS. 2 and 3) and a plurality of external bond pads 42 belonging to segments 36. To insulate the die 32 from the metal interconnects which will be applied to the surface of the wafer 30, a polyimide layer 60 is first deposited on the wafer 30, as shown in FIG. 5B. Although the wafer manufacturers provide a passivation layer on the surface of the wafer 30 that should insulate the circuits, the polyimide layer 60 ensures that there are no holes in the passivation material. The polyimide layer 60 also helps fill in the streets 38 and 40 (see FIG. 3) between the die 32 on the wafer 30. In a preferred embodiment, the polyimide layer 60 is applied by a standard spin coating process in which polyimide is placed in the middle of the wafer 30 and the wafer 30 is spun horizontally on a spin motor to provide a thin polyimide layer 60 on the wafer 30 that is approximately two microns in thickness.

Figure 5C:
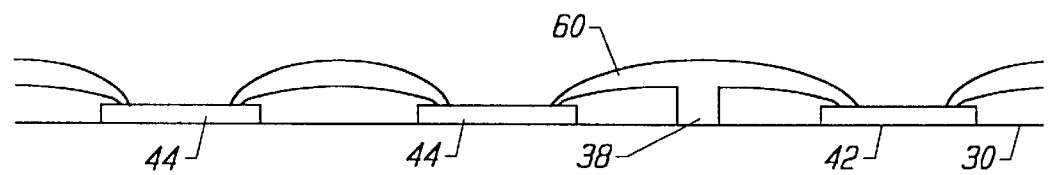

Referring now to FIG. 5C, after the surface of the wafer 30 has been coated with the polyimide layer 60 or other insulating material, the polyimide layer 60 is removed from the surface of the wafer 30 over bond pads 44 and 42. In a preferred embodiment, the polyimide layer 60 is removed over the bond pads 44 and 42 using a standard photolithographic process.

During the photolithographic process, a layer of photosensitive material, called positive photoresist, is applied to the surface of the polyimide layer 60 and baked. Next, a mask having openings defining the location of the bond pads 44 and 42 on the wafer 30 is superimposed on the photoresist using a conventional aligner device. The mask is flooded with ultra-violet radiation and the uncovered portions of the photoresist over the bond pads 44 and 42 is exposed to the light. The exposed photoresist is then stripped from the surface of the bond pads 44 and 42 and developed in a dilute developer. After the bond pads 44 and 42 are exposed, the remaining positive photoresist is removed from the wafer 30 using acetone or other positive photoresist stripper material. Acetone is a material that washes away photoresist but will not damage the polyimide layer 60.

After the photoresist is removed, the wafer 30 is baked to cure the polyimide layer 60. Typically, polyimide is cured for one half-hour at four hundred degrees. In a preferred embodiment of present invention, the polyimide layer 60 is cured for six hours at a temperature of three hundred fifty degrees in order to reduce the possibility of harming the circuitry on the wafer 30.

Figure 6A:
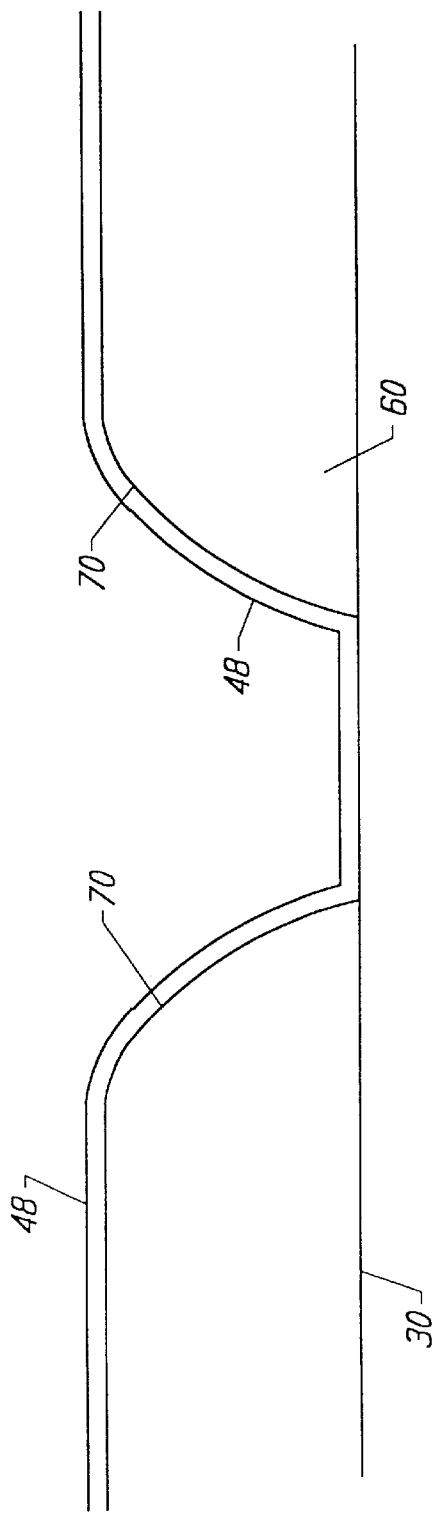
FIGS. 6A and 6B are diagrams illustrating edge wall profiles of a polyimide layer.
Figure 6B:
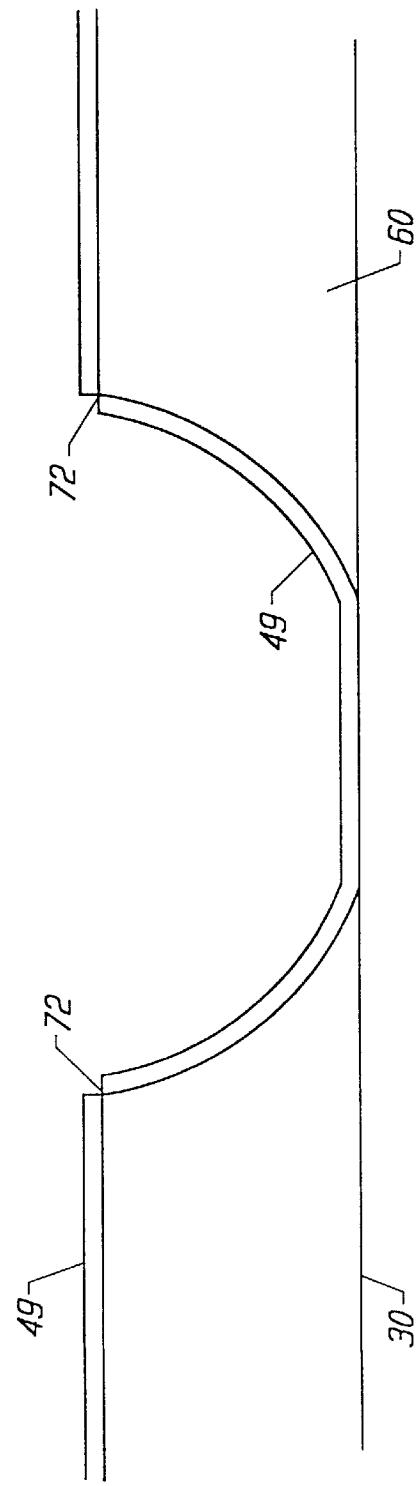

Referring to FIGS. 6A and 6B, in a preferred embodiment, polyimide is used for the insulation layer 60 which produces rounded edge walls 70 in the areas where the polyimide layer 60 is removed, as shown in FIG. 6A. The rounded edge walls 70 of the polyimide layer 60 are desirable to facilitate the deposition of a layer metal 48 which will be applied to the polyimide layer 60. In contrast, a photoimageable polyimide 61 provides edge walls that have sharp corners 72 which results in a discontinuity in the metal layer 49, as shown in FIG. 6B.

Figure 5D:
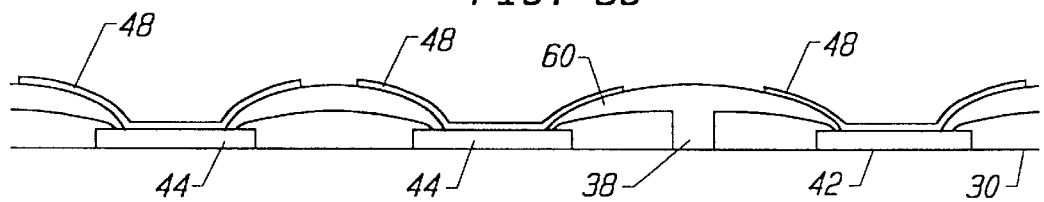

Referring to FIG. 5D, after the polyimide layer 60 is opened over the bond pads 44 and 42, the next stage of the vertical interconnect process is referred to as the metal lift-off process in which a first metal layer 48 is applied to the wafer 30 to electrically interconnect each of the die 32 located on a segment 36. The first metal layer 48 deposited on the wafer 30 contacts the bond pads 44 and 42 and corresponds to the metal y-interconnects 48 of FIG. 3. The paths of the metal y-interconnects 48 across the wafer 30 are defined using a standard photolithographic process.

Referring to FIGS. 7A and 7B, the first step of the metal lift-off process is to apply a layer of lift-off photoresist 74 over the polyimide layer 60. In a preferred embodiment, a commercially available image reversal photoresist is applied to the wafer 30 in a well known manner. The photoresist 74 is then removed in selected areas to define the paths of the metal y-interconnects 48. The image-reversal photoresist 74 is removed such that an overhanging edge, which is referred to as a retrograde or re-entrant edge wall 76, is produced along the path of the metal y-interconnects 48 as shown in FIG. 7A.

After selected areas of the photoresist 74 are removed to define the paths of the metal y-interconnects 48, the wafer 30 is placed into a standard sputtering tool (not shown) which is used to deposit the metal layer 48 over the entire wafer 30. In a preferred embodiment, the metal layer 48 includes a sandwich of chrome, titanium-tungsten, and gold. The chrome and titanium-tungsten are combined with the gold primarily for adhesion purposes, but other metal sandwiches may also be used. In the prior VIP process, approximately two thousand angstroms of chrome, five hundred angstroms of titanium-tungsten, and approximately twelve hundred angstroms of gold are deposited on the wafer 30. In accordance with the present invention, approximately six thousand angstroms of gold are deposited on wafer 30.

Once the metal deposition is performed, the remaining photoresist 74 is removed from the surface of the wafer 30. Photoresist is typically removed by soaking the wafer 30 in acetone or other positive photoresist stripper which dissolves the photoresist 74. Referring to FIG. 7B, as the photoresist layer 74 dissolves, the metal layer 48 lifts away from the surface of the first polyimide layer 60 leaving the metal interconnects 48 (see FIG. 3). The purpose of the re-entrant edge walls 76 is to allow the acetone to flow around the edges of the metal y-interconnects 48 and effectively dissolve the photoresist 74.

After acetone has dissolved the photoresist 74, the wafer 30 is baked to evaporate the acetone that soaked into the polyimide layer 60. After this step, one layer of gold is left on the surface of the polyimide layer 60 defining the y-interconnects 48 which are in contact with the bond pads 44 and 42, as shown in FIG. 5D.

After the metal y-interconnects 48 are provided on the surface of the wafer 30, a second metal layer 46 is provided on the wafer by essentially repeating the process described above. The second metal layer 46 corresponds to the x-interconnects 46 shown in FIG. 3.

Figure 5E:
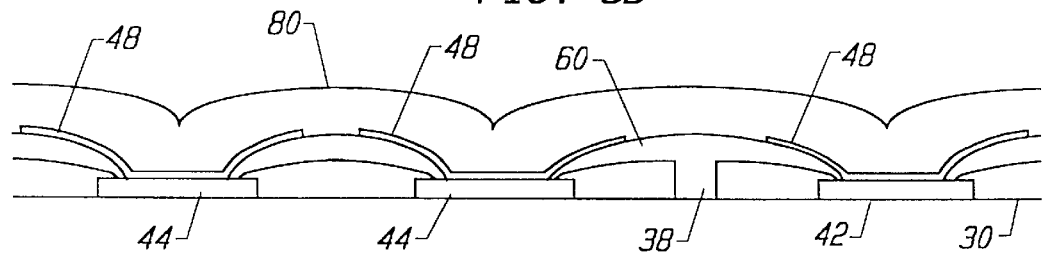
Figure 5F:
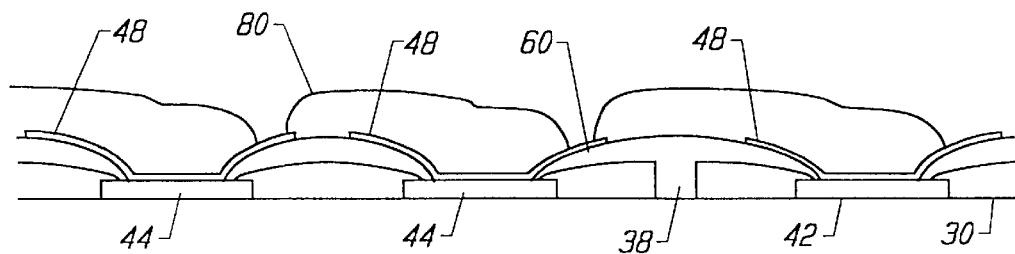

Referring to FIG. 5E, a second polyimide deposition is performed to provide a second polyimide layer 80 on the wafer 30. The second polyimide layer 80 is applied in the same manner as the first polyimide layer 60, but need not be as thick. After the second polyimide layer 80 is applied, holes are opened in the second layer 80 over points on the metal y-interconnects 48 which are to electrically contact the metal x-interconnects 46, as shown in FIG. 5F. The second polyimide layer 80 is also removed from edge bond pads 42 on each segment 36 to allow the second layer of metal interconnects 46 to electrically contact the edge bond pads 42 once the segments 36 are stacked.

In an alternative embodiment, the first metal layer 48 may be used to contact the edge bond pads 42 instead of the second metal layer 46. After the second polyimide layer 80 is removed from the selected points on the wafer 30, the second polyimide layer 80 is cured at a low temperature to prevent interaction between the gold interconnects 48 and the aluminum bond pads 44 and 42 which could produce an undesirable insulating substance.

Figure 5G:
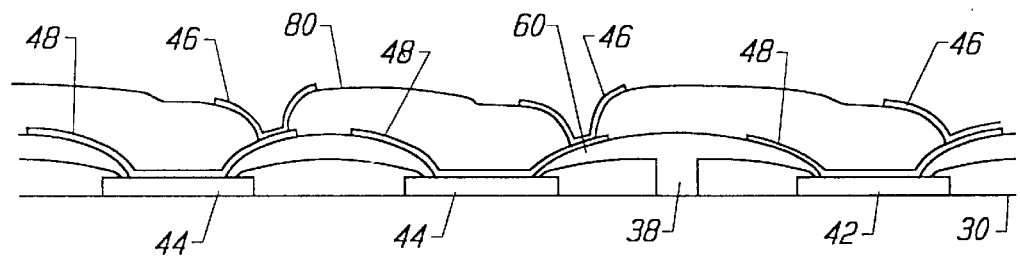

After the second polyimide deposition, a second metal lift-off process is performed to form the second layer of interconnects 46, as shown in FIG. 5G. Once again, an image reversal photoresist is applied to the wafer 30 and the photoresist is removed in places which define the paths of the second layer of gold interconnects 48 on the wafer 30. As described above, the process yields a layer of photoresist defining paths with re-entrant edge walls. In a preferred embodiment, a metal layer including a sandwich of chrome, titanium-tungsten, and gold is then sputter deposited on the photoresist. The chrome is unnecessary in the second layer 48 but may be used for standardization of the manufacturing process. After the second gold deposition is performed, the lift-off step is performed to remove the unwanted photoresist and metal, leaving the x-interconnects 46 of FIG. 3.

Figure 5H:
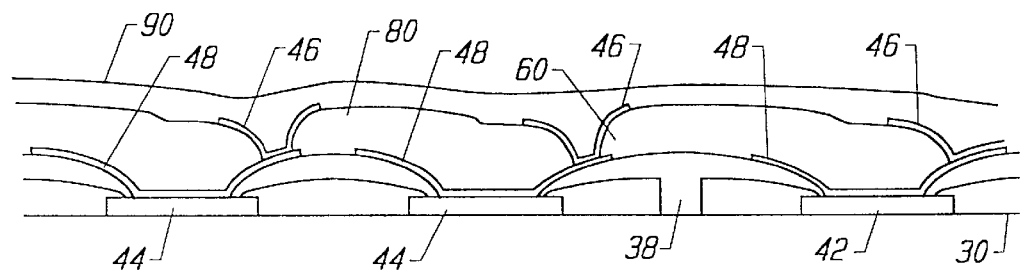

After the second metal layer 46 is deposited, a third polyimide layer 90 is applied to the wafer 30, as shown in FIG. 5H, to protect the metal x-interconnects 46 from scratches and to act as a mechanical barrier to the outside world. The third polyimide layer 90 is removed around the edges of each segment 36 to expose the edge bond pads 42 which will later be in electrical contact with the edge bond pads of other segments. Either a conventional photo-imageable polyimide 90 or a nonphoto-imageable is acceptable to protect the metal x-interconnects 46.

As shown in FIG. 5H, the first polyimide layer 60 protects the circuits on the wafer 30 while the first layer of metal interconnects 48 makes contact with the bond pads 44 and 42. The second polyimide layer 80 insulates the second layer of metal interconnects 48 from the first layer of metal interconnects 46 except where the two layers contact. Finally, the third polyimide layer 90 protects and insulates the second layer of metal interconnects 48.

The two layers of metal interconnects 46 and 48 provided by the wafer interconnect VIP process adds flexibility in routing lines across the wafer 30 to interconnect the die 32 on each segment 36. Interconnecting the die 32 on a segment 36 and then stacking the segments 36, is less costly and more reliable than the prior art method of cutting individual chips from a wafer 30, stacking the chips, and interconnecting the chips on a circuit board.

After the wafer 30 interconnect process, a segment formation process is preformed on the wafer 30. Referring again to FIG. 3, the wafer 30 is divided into individual segments 36 by cutting the wafer 30 along the vertical and horizontal streets 38 and 40 between the segments 36. After the segments 36 are cut from the wafer 30, the segments will be placed in a stacked structure. To reduce the overall size of the structure, the segments 36 are first thinned by grinding away material from the backside of the segments 36. To aid in the thinning process, the entire wafer 30 is thinned before the segments 36 are cut from the wafer 30. The thinning process reduces the height of the wafer 30 and the segments 36 from a height of approximately twenty-five mils to approximately eight to ten mils.

Conventionally, wafers 10 are cut from the front side where the circuits are laid so that the circuitry can readily be seen and not damaged during the sawing process. In the present invention, however, the wafer 30 is sawed on the backside of the wafer 30 along the streets 38 and 40 using a bevel cut. FIG. 8A shows the backside 100 of a segment 36 after the segment 36 has been cut from a wafer using a bevel cut. As shown, the bevel cut provides the segment 36 with inwardly sloping edge walls 102 on all four sides of the segment 36.

In the prior VIP process, in order to cut the wafer 30 from the backside 100, a pattern of streets 38 and 40 defining segment boundaries is provided on the backside 100 of the wafer 30 to guide the saw. A pattern of the segment boundaries is provided on the backside 100 placing the wafer 30 in a device including a video camera and a felt-tipped writing device. The wafer is mounted in the device such that the front-side of the wafer 30 faces the camera while the writing device is placed in contact with the backside 100 of the wafer 30. The image of the front-side of the wafer 30 is displayed on a monitor and an operator moves the wafer 30 beneath the writing device along the pattern of the segment boundaries to draw the patterns on the backside 100 of the wafer 30.

Alternatively, in the prior VIP process, a pattern of the segment boundaries may also be provided on the backside 100 of the wafer 30 using a conventional photolithographic process. During this process, the backside 100 of the wafer 30 is coated with photoresist, the front of wafer 30 is illuminated with infrared light such that the circuitry may be seen on the backside 100 of the wafer 30, and a pattern of the segment boundaries is aligned and developed on the surface of the backside 100 of the wafer 30 in order to guide the saw.

After the pattern of the segment boundaries is provided on the backside 100 of the wafer 30, and before the wafer 30 is sawed, a layer of tape is applied to the front of wafer 30 to hold the segments 36 together during sawing. After the front of the wafer 30 is taped, a bevel cut is performed along the segment boundaries on the backside 100 of the wafer 30. In a preferred embodiment of the present invention, the bevel cut produces segment edge walls 102 having a 45-degree angle. After the segments 36 are cut, the tape is carefully removed from the front of the wafer 30 and the segments 36 are cleaned to remove residue from the sawing process and the tape.

FIG. 8B shows three segments 36 placed in vertical alignment above one another, after the segments are cut from a wafer 30, and just before the segments are assembled permanently into a stack. As shown, the front side 104 of each segment 36 contains the metal interconnects 48 and 46, and the edge bond pads 42. Once the segments 36 are assembled into a stack, the edge bond pads 42 of a segment 36 will be in electrical contact with the edge bond pads 42 of vertically adjacent segments 36 in the stack. The purpose of the beveled edge walls 102 is to provide suitable clearance for a vertical electrical connection between the edge bond pads 42 of one segment 36 and the edge bond pads 42 of the segment 36 immediately below the first in the stack.

As previously described in the prior VIP process, after cleaning, the backside 100 and the beveled edges 102 of the segments 36 are insulated using a sputtered nitride process. A sputtered nitride process is similar to the sputtering of the metal films, except instead of a metal, a silicon nitride is sputtered onto the backside 100 of the segment 36. The silicon nitride insulation is necessary so that noise and interfering signals are not absorbed into the silicon substrate base of the die 32 on segments 36.

After the segments 36 are cut from the wafer 30 and insulated, the circuits on the segments 36 are tested for functionality. Since a portion of the die 32 on a wafer 30 may not function, and the defective die are not cut from the wafer 30 and discarded as in prior art methods, the defective die must be disconnected from the functioning die 32. Defective die may be disconnected by using a laser to vaporize the top layer of metal interconnects 46 that are connected between the edge bond pads 42 of a segment 36 and the circuits of the defective die. The defective die may also be disconnected by mechanically abrading or electrically fusing the top layer of metal interconnects 46. Once the top layer of metal interconnects 46 has been opened between the edge bond pads 42 of a segment 36 and the circuits of a defective die, the defective die is no longer electrically connected to the segment 36.

Besides disconnecting defective die, each segment 36 is also made unique so that decoding circuitry, which will interface with the finished stack, may access each segment 36. In the prior VIP process, each segment 36 is made unique during a process called level programming in which a plurality of control signals are burned on each segment using a laser. Referring back to FIG. 3, the plurality of control signals is provided on each segment by burning a unique pattern onto control bond pads 106 on each segment 36, although a unique pattern could also be formed by electrically blowing fuses.

After each of the segments 36 are made unique with respect to one another, the segments 36 are programmed. For the purposes of this disclosure, programming refers to the process of routing circuitry so that redundant functional die 32 replace the disconnected defective die. This is done by providing the replacement die 32 with appropriate control signals originally intended for the disconnected die. Programming is necessary because once the segments 36 are stacked and become operative, a computer or the like may attempt to access a disconnected die in the stack. Therefore, the segments 36 which have defective die must be programmed so that when an attempt is made to access a defective die in a stack, a functioning die 32 is accessed instead. The actual programming of the segments 36 occurs during the fabrication of a stack, as described below.

Figure 9:
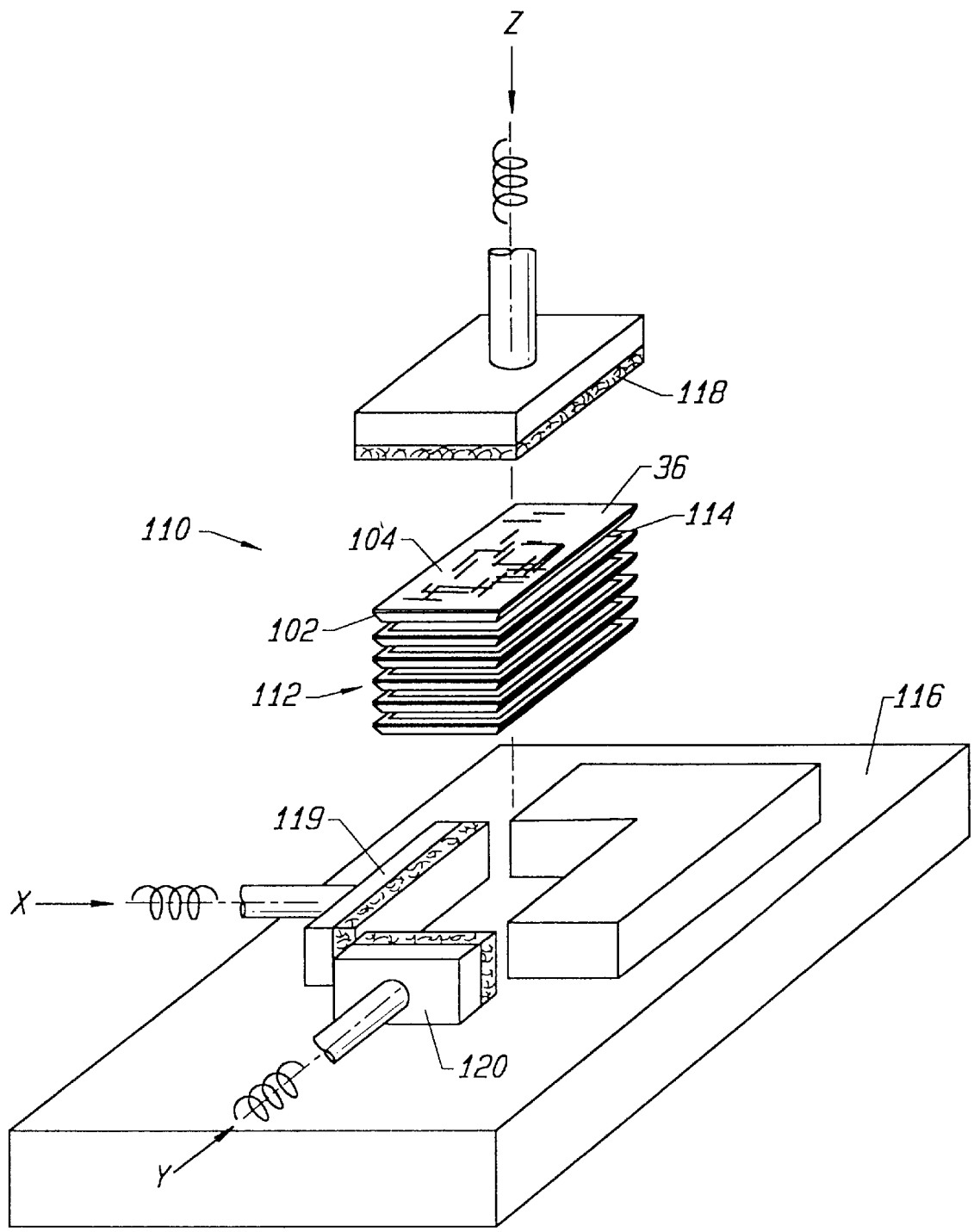
FIG. 9 is a diagram illustrating a segment stacking and gluing procedure in which segments are stacked and epoxied together.

Referring to FIG. 9, a segment gluing fixture 110 is shown wherein a stack 112 is assembled during a stacking procedure in which the segments 36 are stacked and epoxied together. In the prior VIP process, during the stacking procedure, a stack 112 is assembled using six adjacent segments 36 to provide six logical levels. A stack 112 is assembled by providing a film of epoxy 114 between each pair of adjacent segments 36, and then placing the segments 36 front side 104 up in an alignment fixture 116. The alignment fixture 116 compresses the stack 112 in a horizontal plane against fixed walls of the fixture, and compresses the stack 112 in a vertical plane against the base of the fixture using three closed-cell urethane nibbler stamps 118, 119, and 120. The stack 112 is then cured at one hundred twenty degrees while remaining in the fixture to solidify the stack 112. The cure cycle includes a fifteen minute stabilization period, a sixty minute cure, and a ten minute cool down. The VIP process is an improvement over prior methods in which individual die 32 are stacked, because the segments 36 comprising the stack 112 of the present invention may be of varying thickness and may be stacked in any order.

After the stack 112 solidifies, the edge bond pads 42 (see FIG. 8B) on each of the segments 36 is vertically electrically connected in the stack 112 in order to provide an electrically functional stack 112. Prior art methods for vertically connecting elements of a stack include connecting the elements with metal rods, and providing a plurality of visa in the elements and inserting an electrically conductive material in the visa, or filling the visa with a conductive liquid to provide an electrical path between the elements of the stack.

Figure 10A:
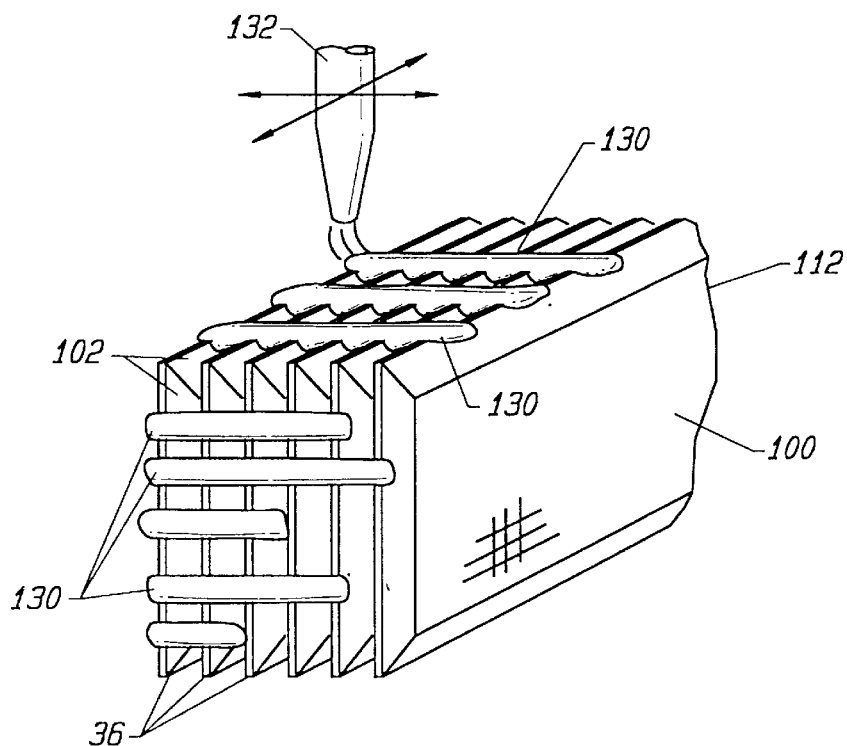
FIGS. 10A and 10B are diagrams illustrating a method for providing a vertical electrical path between segments in a stack according to the present invention.
Figure 10B:
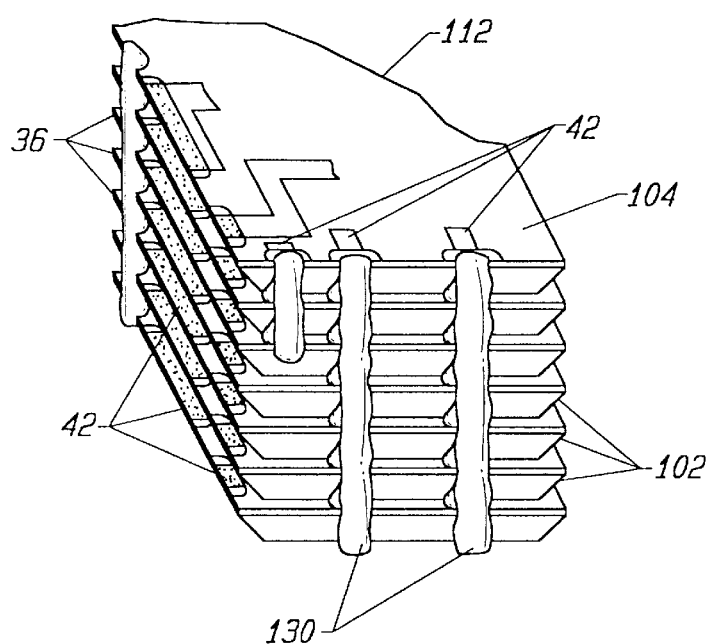

Referring to FIGS. 10A and 10B, a method for providing a vertical electrical path between segments 36 of a stack 112 is shown according to the present invention. FIG. 10A depicts a stack 112 from the backside 100 of the segments 36 with the stack positioned on its side. FIG. 10B depicts a view of the stack 112 from the front side 104 of the segments 36 where the stack is positioned vertically. To provide a vertical electrical path between segments 36 of a stack 112, silvered-filled conductive epoxy traces 130 are dispensed by a dispense mechanism 132 along the beveled edge walls 102 of the segments 36. The dispense mechanism 132 moves in an x- and y-direction and places the epoxy traces on the stack 112 in alignment with the external bond pads 42 of the segments 36. The epoxy traces 130 are applied to all four edges of the stack 112 in preprogrammed locations and the epoxy traces 130 flow to vertically connect the exposed metal of the bond pads 42. The beveled edge walls 102 of the segments 36 facilitate access to the external bond pads 42 by the epoxy traces 130. The use of beveled edge walls 102 and the epoxy traces 130 of the VIP process is an improvement over prior art methods that use a layer of metallization to provide a vertical electrical connection to a stack.

As shown in FIGS. 10A and 10B, the epoxy traces 130 are selectively dispensed to different layers of the stack 112 according to preprogramming. The various epoxy traces 130 define circuit paths of a particular device and also route circuitry around disconnected defective die. When the segments 36 are stacked one on top of another to assemble a stack 112, each location of a die 32 on the segments 36 defines a vertical column in the stack 112. For example, if each segment 36 in a stack 112 includes six die 32, the stack 112 include six vertical columns of die 32. In order to have a functioning circuit, such as a memory circuit, a certain number of functioning die 32 is required in each vertical column of a segment 36. As previously described, in the prior VIP process, the circuitry of a stack 112 that includes six segments is routed during programming to provide four functioning die 32 in each column of the stack. However, other configurations are possible according to the present invention. For example, a stack of 8–12 adjacent segments could be configured to provide eight logical levels of die in each column of the stack.

Figure 11:
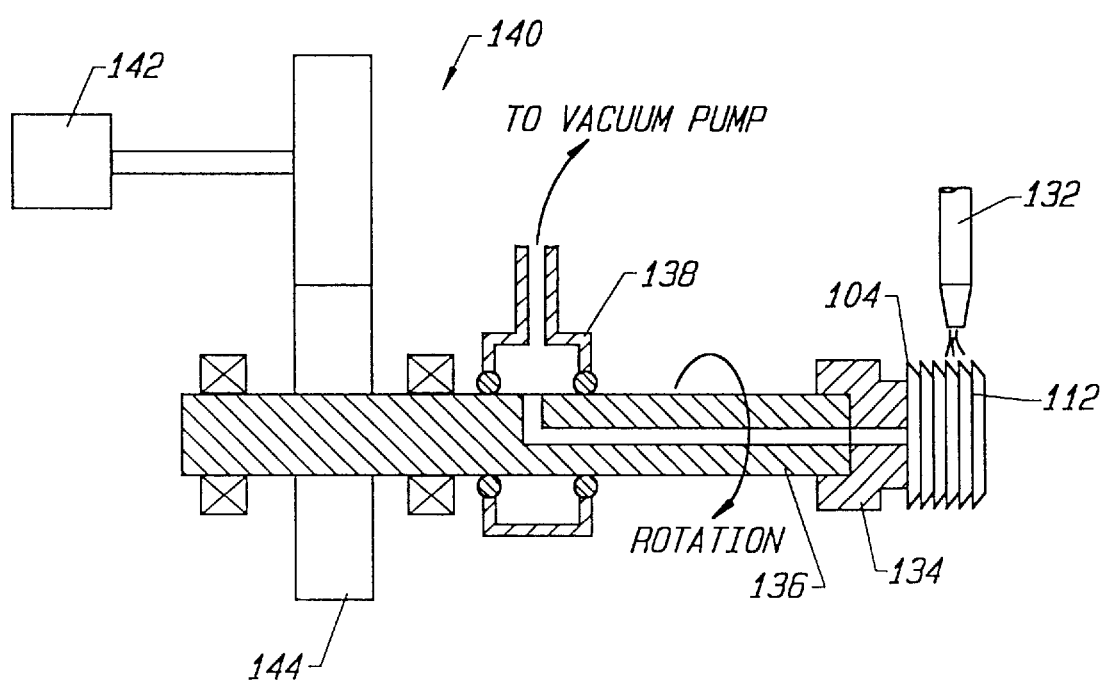
FIG. 11 is a diagram illustrating the mechanism by which epoxy traces are dispensed along the edges of a stack.

Referring to FIG. 11, the mechanism by which the epoxy traces 130 are dispensed is shown. The dispensing mechanism 140 includes a rotary indexing vacuum chuck 134, a dispense mechanism 132, a sealed rotary vacuum joint 138, a motor 142, and a 90-degree indexing mechanism 144. The sealed rotary vacuum joint 138 works in conjunction with a vacuum pump (not shown) to create a vacuum at the end of the vacuum chuck 134, which is located beneath the dispense mechanism 132. A stack 112 is placed horizontally on the vacuum chuck 134, and the chuck 134 holds the stack 112 on its front side 104, via the vacuum. After the stack 112 is placed up against the chuck 134, the dispense mechanism 132 is moved above one edge of the stack 112 to dispense pre-programmed channels of epoxy traces 130 down one side of the stack 112, as described above. The dispense mechanism 132 is moved away and the vacuum chuck 134 is then rotated 90-degrees by the 90-degree indexing mechanism 144 so that the epoxy may be dispensed along another edge of the stack 112. The process repeats until all the edges of the stack 112 are epoxied. In a preferred embodiment, the epoxy dispense mechanism 132 is a 30 gage, Luer-tipped 5 cc hypodermic syringe having a resolution of one-thousandths of an inch, and is mounted on a programmable robot (not shown).

After the epoxy traces 130 are dispensed, the stack 112 is removed from the chuck 134 and placed in a holding area with special handling because the epoxy 130 is wet. The epoxied segment stacks 112 are then placed in a convection oven for curing, which includes a fifteen minute preheat, a sixty minute cure, and a ten minute cool down. Once the stack 112 is tested for electrical functionality, the stack 112 process is complete and the stack 112 is ready for mounting on a circuit carry substrate, such as a printed circuit board, for example.

Figure 12:
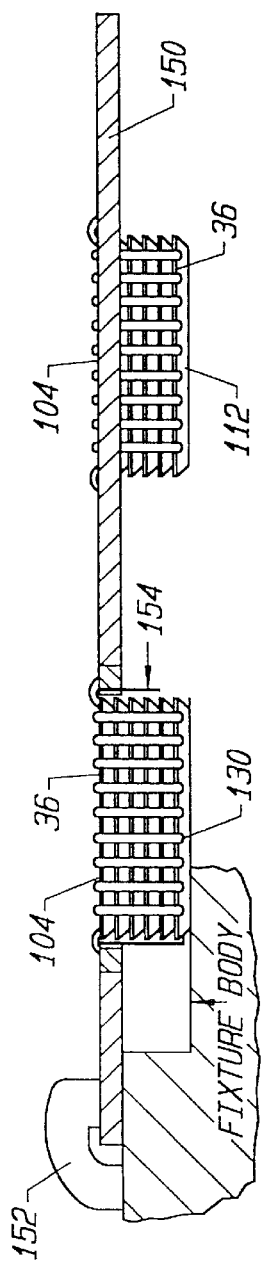
FIG. 12 is cross-sectional view of a signal carrying substrate having a plurality of stacks which are subsurface mounted therein in accordance with the present invention.

In the prior VIP process, the stack 112 can be connected to a circuit board by subsurface mounting the stack 112 in the circuit board. Referring to FIG. 12, a cross-sectional view of a circuit board 150 is shown having a plurality of stacks 112 subsurface mounted therein in accordance with the VIP process. To subsurface mount the stacks 112 in the circuit board 150, a plurality of holes 154 slightly larger than the perimeter of the stacks 112 are cut in the circuit board 150. After the holes 154 are cut into the circuit board 150, the circuit board 150 is placed in a clamping fixture 152. The stacks 112 are then placed in the holes 154 in the circuit board 150 so that the front side 104 of the top segment 36 of the stack 112 is coplaner with the printed circuit board 150, as shown. The stacks 112 are held in place for forthcoming operations by applying small drops of fast-curing positionally epoxy (not shown) at various locations around the perimeter of the stacks 112.

Although the stack 112 could also be mounted on top of the circuit board with epoxy, subsurface mounting overcomes problems which may be encountered when applying epoxy on the circuit board around the stack 112 and then applying the epoxy up the vertical sides of the stack 112. Subsurface mounting the stacks 112 in a circuit board 150 provides numerous advantages which include: allowing for coefficient of thermal expansion, reducing the overall height of the stack 112 on the circuit board 150 so the stacks 112 may be made taller for added density, and simplifying the electrical connection between the stack 112 and the circuit board 150, as will now be described.

Figure 13:
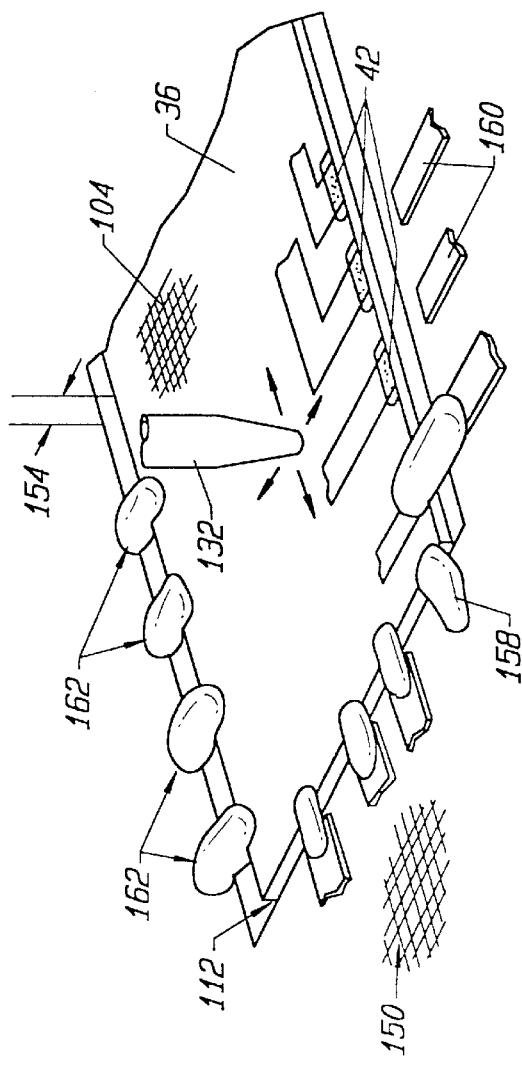
FIG. 13 is a diagram illustrating a method for electrically connecting a subsurface mounted stack to a circuit board.

Referring to FIG. 13, a method for electrically connecting a stack 112 to the circuit board 150 is shown for the prior VIP process. After the positioning epoxy 158 is applied to hold the stacks 112 to the circuit board 150, the stacks 112 are electrically connected to metal traces 160 on the circuit board 150 so that the computer circuitry can access the die 32 on each level of the stack 112. Each stack 112 is positioned in the circuit board 150 so that the edge bond pads 42 around the perimeter of the top segment 36 match the positions of the metal traces 160 on the circuit board 150. To bridge the gap between the bond pads 42 and the metal traces 160 on the circuit board 150, silver filled conductive epoxy whiskers 162 are applied from each bonding pad 42 to an opposing metal trace 160 on the circuit board 150 using the dispense mechanism 132. As shown in FIG. 13, the positionally epoxy 158, which is used to affix the stack 112 to the circuit board 150, is applied so as to not interfere with the conductive epoxy whiskers 162. One feature of the VIP process is that electrical contact between the stack 112 and the metal traces 160 on the circuit board 150 is made with conductive epoxy whiskers 162 which lie in substantially the same plane as the circuit board 150.

The horizontal epoxy whiskers 162 of the prior VIP process provide an electrical connection between the circuit board 150 and the edge bond pads 42 of the top segment 36 in a stack 112, and between the edge bond pads 42 of the top segment 36 and the vertical epoxy traces 130 which were applied down the edges of the stack 112 to interconnect the segments 36. The horizontal and vertical conductive epoxy traces 160 and 132 applied to the stack 112 enable the circuits of the circuit board 150 to access any segment 36 in the stack 112.

In the prior VIP process, after the segments are vertically interconnected using the epoxy traces 130 (see FIGS. 10A and 10B), another level of programming may be employed at the circuit board level 150 to remedy the failure of any of the die on the segments 36. Die failures are remedied by deselecting the control signal for the defective die at the circuit board level and replacing the signals with the control signals of a functioning die 32 in the stack 112. This is accomplished by interconnecting the appropriate metal traces 160 on the circuit board 150 with the conductive epoxy whiskers 162.

After the epoxy whiskers 162 are applied to the circuit board 150, the board 150 assembly is placed in a convection oven for a final cure which includes: a fifteen minute preheat, a sixty minute cure, and a fifteen minute cool-down. After the cure, the board 150 assembly may be tested and then encapsulated with a polyimide layer. In the prior VIP process, the completed circuit board 150 assembly of the present invention may then be used for many purposes, such as in a Personal Computer Memory Card International Association (PCMCIA) card. A PCMCIA card is a small credit card sized device that is inserted into notebook and portable computers to provide additional input/output functions and increased storage. The stacks of the VIP process may be mounted in a PCMCIA card and used as external memory circuits for a notebook computer, for example.

DIELECTRIC ISOLATION PROCESS

Now that the detailed aspects of the Vertical Interconnect Process (VIP) described in the above cross-referenced patent application have been described, the dielectric isolation features of the present invention will be described in detail.

One such feature is the use of a dielectric isolation process. The improved VIP process uses an insulating dielectric to isolate the entire edge of the die electrically. In the prior VIP process described above, silicon nitride is used as an insulating dielectric.

It has been found that better dielectrics can be utilized which are made out of polymers. One particularly suitable dielectric which can be used for this purpose is called Parylene™ The dielectric isolation etch process according to the present invention provides a conformal coating placed around the edge of the die to protect and insulate the die. In one embodiment, the polymer coating is vacuum deposited.

Figure 14:
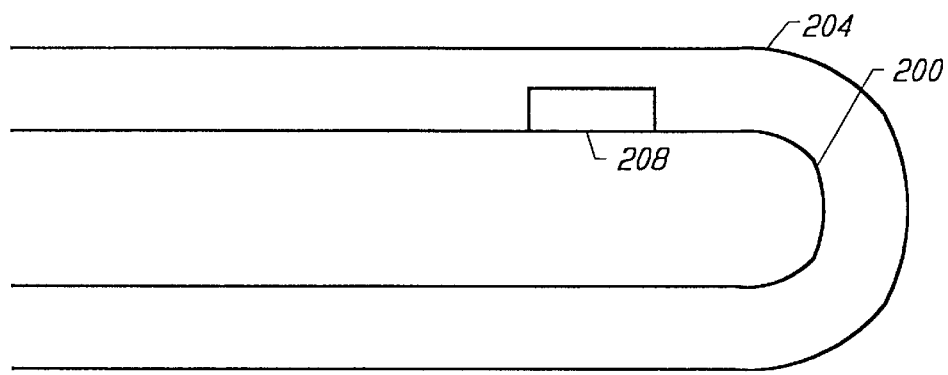
FIG. 14 is a cross sectional view of a portion of a die according to the present invention having a conformal dielectric coating.
Figure 15:
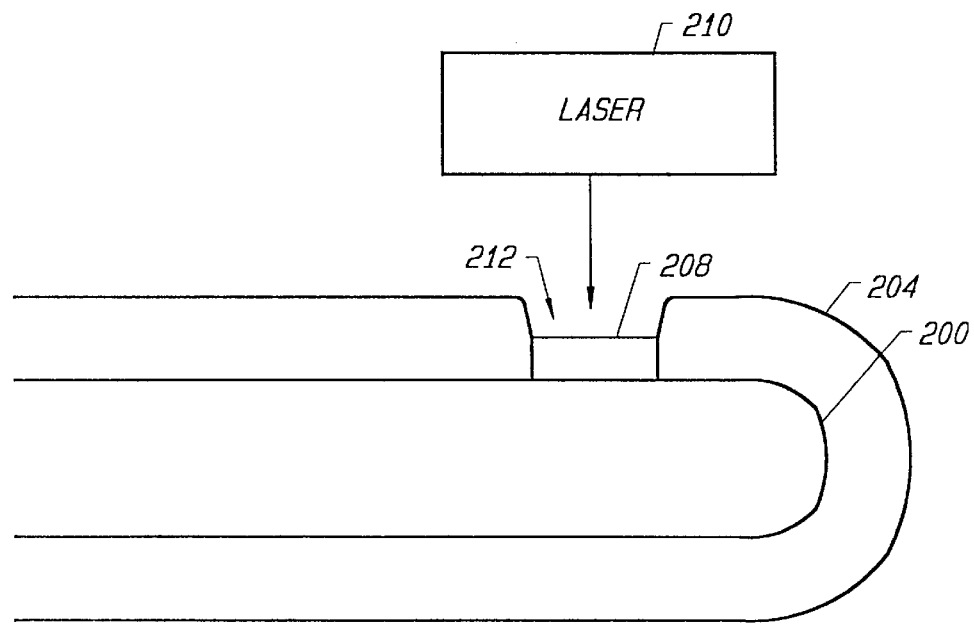
FIG. 15 is a cross sectional view of the die of FIG. 14 showing use of a laser to ablate a portion of the dielectric coating.

FIG. 14 shows a cross section of a die 200 and a bond pad 208 both of which are coated with an insulating polymer coating 204, such as Parylene™. The improved process then uses a laser to ablate the polymer. FIG. 15 shows the area of ablation 212 in order to remove the coating 204 over the bond pad 208 to which an electrical connection is to be made. The prior VIP process uses silicon nitride, which can be brittle and exhibit other problems.

The dielectric isolation process according to the present invention provides a conformal coating 204 completely around the edge of the die 200. Silicon nitride deposits in a more directional way and will not coat the edges of a die in a conformal manner. One problem is that silicon nitride tends to crack at the corners because silicon nitride is much like a hard piece of glass and can crack when bent around the edges of the die. The conformal coating according to the present invention can be bent around the edges of the die.

Another feature related to the improved VIP process is that once the die 200 in FIG. 14 has been conformally coated with coating 204, a means of selectively removing portions of the conformed coating at locations or openings where an electrical connection to the bond pad 208 is desired. As shown in FIG. 15, in one preferred embodiment, laser 210 is used for the purpose of ablating or removing the conformal coating 204 in areas where it is desired to make openings for electrical connections with bond pad 208. FIG. 15 also shows the area of ablation 212 in order to remove the coating 204 over the bond pad 208 to which an electrical connection is to be made. As described above, a desirable feature of the dielectric isolation etch process provides a conformal plastic coating placed around the edge of the die to protect and insulate the die.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming a segment of silicon having a plurality of edges defining said segment, the method comprising the steps of:
   providing one or more die on said segment, each of said die including a plurality of first bond pads;
   locating a plurality of edge bond pads located on more than one of said edges of said segment for external electrical connections;
   connecting one or more layers of metal traces between said plurality of first bond pads to interconnect said die, said metal traces further connected between said plurality of edge bond pads and said plurality of first bond pads to connect said die to said external connections;
   forming a conformal dielectric coating around the edge of said die and over said bond pads;
   making openings in the conformal coating at selected locations to form openings for making electrical connections to said bond pads; and
   wherein said segment further includes a front side and a backside, and wherein said plurality of first bond pads, said plurality of edge bond pads, and said layer of metal traces are located on said front side of said segment.

2. The method as in claim 1 including the step of using a laser to form said openings.

3. The method as in claim 1 wherein said edges defining said segment further include edge walls, and wherein said edge walls and said backside of said segment are insulated with said conformal dielectric coating.

4. The method as in claim 3 wherein said edge walls are beveled.

5. A method of forming a stack of electrical circuitry, the method comprising the steps of:
   vertically placing a stack of segments on top of one another, each of said segments including a plurality of die having circuitry therein, and electrically conductive contact points;
   interconnecting said plurality of die on each of said segments and connecting one or more of said plurality of die to one or more of said electrically conductive contact points on each of said segments;
   providing access to said electrically conductive contact points on each of said segments;
   electrically interconnecting said electrically conductive contact points on each of said segments in said stack, and providing a lateral electrical connection to said plurality of die located in each of said segments in said stack,
   forming a conformal dielectric coating around the edge of said die and over said bond pads;
   making openings in said conformal coating at selected locations for making electrical connections to said contact points;
   wherein said electrically conductive points are located along more than one of said edges on each of said segments;
   including more than one layer of metal traces; and
   wherein said layer of metal traces includes a sandwich of chrome titanium-tungsten, and gold.

6. The method as in claim 5 including the step of using a laser to make said openings.

7. The method as in claim 5 including inwardly sloping edge walls along each of said edges of said segments.

8. The method as in claim 7 wherein said interconnecting step includes electrically conductive epoxy.

9. The method as in claim 8 wherein each of said segments include control bond pads and wherein said segments are made unique with respect to one another by having a unique pattern formed onto said control bond pads on each of said segments.

10. The method as in claim 8 wherein said segments include interconnected functioning die and non-functioning die, and wherein said non-functioning die are disconnected from said functioning die, and said metal traces on each of said segments are routed so that particular ones of said functioning die replace said non-functioning die.

11. The method as in claim 9 wherein said stack includes at least two of said segments, each of said two segments includes at least one of said die, said stack having at least one vertical column of said die being of two of said die in height.

12. The method as in claim 11 wherein said stack includes six of said segments, each of said six segments includes four of said die, said stack having four vertical columns of said die, each of said vertical columns being six of said die in height, and wherein said electrically conductive epoxy is applied to said six segments such that four of said functioning die are connected in each of said four vertical columns of said die in said stack.

13. The method as in claim 12 wherein said stack includes between eight and twelve of said segments and each of said segments includes four vertical columns of die so as to form four stacks of eight functioning die.

14. A method of forming a stack of segments, comprising the steps of:

providing a wafer having a plurality of die;

creating a plurality of segments, each one of said plurality of segments formed by grouping a plurality of adjacent ones of said die on said wafer;

interconnecting said plurality of adjacent die on said each of said plurality of segments;

separating said each one of said plurality of segments from said wafer;

placing said plurality of segments on top of one another to create a stack of segments, said stack having external vertical sides;

electrically interconnecting said stack of segments;

forming a conformal dielectric coating around the edge of said die and over said bond pads;

making openings on said conformal coating at selected locations for making electrical connections to said contact points, providing internal electrically conductive contact points on each of said plurality of die;

providing external electrically conductive contact points on said each one of said plurality of segments;

providing a layer of metal traces on said each one of said plurality of segments, said metal traces extending between said internal electrically conductive contact points on said plurality of die and said external electrically conductive contact points on said each one of said plurality of seaments;

applying electrically conductive epoxy to more than one of said external vertical sides of said stack such that said electrically conductive epoxy is in contact with said external electrically conductive contact points on said each one of said segments in said stack, to thereby electrically interconnect said plurality of segments in said stack.

15. A method as in claim 14 including the step of using a laser to make said openings.

16. A method for forming a stack of segments as in claim 15 further including the steps of:

providing control bond pads on each of said segments;

providing control signals to said stack from an external source for access to said segments in said stack; and making said control signals for each of said segments unique by burning a unique pattern into said control bond pads on each of said segments.

17. A method for forming a stack of segments as in claim 16 wherein said stack includes a top segment, said method further comprising the steps of:

providing a signal carrying substrate having circuitry and a hole therein;

affixing said stack of segments in said hole; and electrically connecting said stack of segments to said signal carrying substrate by applying traces of electrically conductive epoxy between said signal carrying substrate and said external electrically conductive contact points on said top segment of said stack.

18. A method for forming a stack of segments as in claim 17 wherein said top segment is co-planer with the surface of said signal carrying substrate.

19. A method for forming a stack of segments as in claim 18 wherein said traces of electrically conductive epoxy lie in substantially the same plane as said signal carrying substrate.

* * * * *